United States Patent [19]

Manley

[11] Patent Number: 5,063,172

[45] Date of Patent: Nov. 5, 1991

[54] MANUFACTURE OF A SPLIT-GATE EPROM CELL USING POLYSILICON SPACERS

[75] Inventor: Martin H. Manley, San Jose, Calif.

[73] Assignee: National Semiconductor Corporation, Santa Clara, Calif.

[21] Appl. No.: 650,740

[22] Filed: Feb. 5, 1991

Related U.S. Application Data

[62] Division of Ser. No. 545,397, Jun. 28, 1990.

[51] Int. Cl.⁵ .......................................... H01L 21/265
[52] U.S. Cl. ........................................ 437/43; 437/44; 437/52; 437/195
[58] Field of Search ................... 437/43, 49, 52, 191, 437/193, 195, 44; 357/23.5

[56] References Cited

U.S. PATENT DOCUMENTS

| | | | |
|---|---|---|---|
| 4,639,893 | 1/1987 | Eitan | 365/185 |
| 4,794,565 | 12/1988 | Wu et al. | 357/23.5 |
| 4,808,261 | 2/1989 | Ghidini et al. | 437/52 |
| 4,861,730 | 8/1989 | Hsia et al. | 437/43 |

FOREIGN PATENT DOCUMENTS

| | | | |
|---|---|---|---|
| 0335395 | 10/1989 | European Pat. Off. | 357/23.5 |
| 0054668 | 3/1983 | Japan . | |
| 0058272 | 3/1986 | Japan . | |

OTHER PUBLICATIONS

Ali et al., "A New Staggered Virtual Ground Away Architecture Implemented in a 4Mb CMOS EPROM", 1989 VLSI Circuits Conference, Tokyo, Japan.

G. Perlegos et al., "A 64K EPROM Using Scaled MOS Technology", ISSSCC Digest of Technical Papers, 1980 IEEE International Solids State Circuits Conference, pp. 142-143.

Primary Examiner—Brian E. Hearn
Assistant Examiner—C. Chaudhari
Attorney, Agent, or Firm—Limbach, Limbach & Sutton

[57] ABSTRACT

The present invention provides an integrated circuit fabrication method that utilizes a conductive spacer to define the gate length of the series select transistor in a split-gate memory cell. Since the length of the spacer can be controlled with great precision using existing integrated circuit process technologies, misalignment problems associated with the prior art split-gate cells are eliminated.

4 Claims, 5 Drawing Sheets

MANUFACTURE OF A SPLIT-GATE EPROM CELL USING POLYSILICON SPACERS

This is a divisional of application Ser. No. 545,397, filed Jun. 28, 1990.

BACKGROUND OF THE INVENTION

1. Field of the Invention

The present invention relates to split-gate memory cells of the type utilizable in an erasable programmable read only memory (EPROM) and, more particularly, to a split-gate memory cell that utilizes a polysilicon spacer to define the gate length of the series select transistor in a virtual-ground split-gate EPROM cell. Since the length of the polysilicon spacer can be controlled with great precision, misalignment problems associated with prior art split-gate cells are eliminated, thereby reducing cell size.

2. Discussion of the Prior Art

Virtual-ground split-gate EPROM cells have been proposed as a means for improving on the packing density and yield of conventional "T" EPROM cells. These cells offer two key features. First, the use of buried N+ bits lines drastically reduces the number of contacts needed in the memory array. This confers an immediate yield advantage, since metal coverage of contact topology is a significant cause of yield loss in scaled integrated circuit technologies. By sharing bit line contacts among a large number of cells, the layout area associated with each cell is further reduced. Second, providing a series select transistor associated with each floating gate insures that the cell cannot be inadvertently turned on due to voltage coupled from the drain to the floating gate. This significantly relieves the constraints on drain programming voltage experienced with a convention T-cell EPROM. Furthermore, associating a series select transistor with each floating-gate confers asymmetry to the operation of the cell. If the source and drain terminals of the cell are interchanged, no programming can take place. This considerably simplifies the programming decoding of the array, since the cell next to the one being programmed is inherently resistant to programming: it cannot be disturbed by the high voltage applied to its source node, which also serves as the drain node of the programmed cell.

U.S. Pat. No. 4,639,893 issued Jan. 27, 1987 to Boaz Eitan discloses an implementation of a virtual-ground split-gate EPROM cell. A second split-gate cell implementation has been reported by Ali et al., "A new Staggered Virtual-Ground array architecture implemented in a 4Mb CMOS EPROM", 1989 VLSI Circuits Conference, Tokyo, Japan.

These two implementations of a split-gate cell have the same cross-section, which is shown in FIG. 1A. The cells differ only in the way in which they are arrayed. The Eitan array is illustrated in FIG. 1B. The Ali et al array is illustrated in FIG. 1C.

Both of these cells suffer from the same major problem. That is, the length of the series select transistor is defined by the masking of the buried N+ layer. This creates several problems. First, the length of the series select transistor and, hence, the electrical characteristics of the cell, are dependent upon the alignment of the buried N+ region to the polysilicon floating gate. This introduces significant variation in cell performance from die to die and from wafer to wafer. Second, the uncertainty in the final position of the buried N+ region causes variation in the series resistance of the buried bit line, causing further variation in cell performance. Third, in order to insure that the resistance of the buried N+ bit line is acceptably low, under worst-case misalignment of the buried N+ region, the width of the buried N+ bit line must be drawn wider than the required minimum. This increases the overall area of the cell.

SUMMARY OF THE INVENTION

The present invention provides a split-gate EPROM cell that uses a polysilicon spacer to define the gate length of the series select transistor. The length of the polysilicon spacer can be controlled with great precision using existing integrated circuit process technologies and, therefore, can eliminate the misalignment problems associated with the prior art split-gate cells.

To fabricate a split-gate memory cell in accordance with the present invention, a floating gate is formed on a layer of insulating material overlying a semiconductor substrate. A second layer of insulating material is then formed on the floating gate. Opposing sides of the floating gate are then sealed with insulating material. Next, a conductive spacer is formed adjacent to one of the opposing sides of the floating gate. The conductive spacer is insulated from the floating gate by the seal and from the substrate by the first layer of insulating material. Next, the spacer is utilized to define a self-aligned source region while the floating gate is utilized in the self-aligned definition of the drain region. This process results in the floating gate extending only over a portion of the channel region in the manner of a convention split-gate cell, and with the spacer being positioned over the remaining portion of the channel between the floating gate and the source region. A conductive control gate is then formed in electrical contact with the conductive spacer. The control gate also extends over the floating gate, but is electrically insulated from the floating gate by the second layer of insulating material.

A better understanding of the features and advantages of the present will be obtained by reference to the following detailed description of the invention and accompanying drawings which set forth illustrative embodiments in which the principals of the invention are utilized.

DETAILED DESCRIPTION OF INVENTION

FIGS. 2A-2E show a sequence utilizable for fabricating a split-gate memory cell in accordance with the present invention.

Figure 2A:
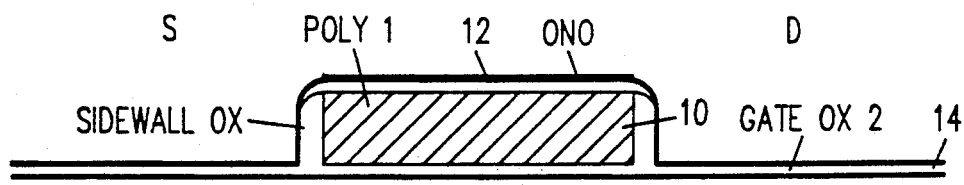
FIGS. 2A-2E are cross-sectional views providing progressive illustration of a method of forming a split-gate memory cell in accordance with the present invention.

In FIG. 2A, a layer of first polysilicon has been deposited on gate oxide and then doped in the conventional manner. Following conventional formation of an oxide-nitride-oxide (ONO) layer 12, the ONO/polysilicon layers are patterned and etched to define a polysilicon floating gate 10. This etching process typically also results in the etching of a portion of the gate oxide layer. A re-oxidation is then been performed to seal the sides of the polysilicon gate 10 with sidewall oxide and to regrow the gate oxide to form gate oxide layer 14.

Figure 2B:
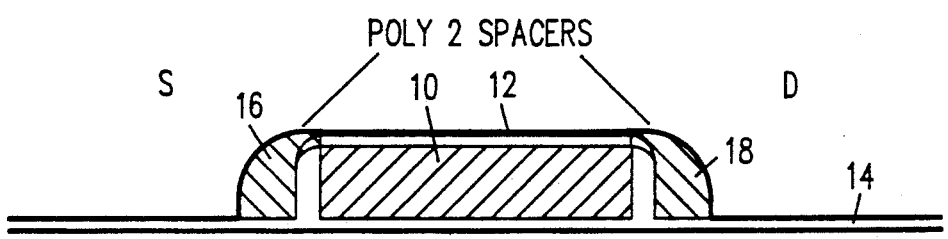

Next, as shown in FIG. 2B, and in accordance with the present invention, a layer of second polysilicon (approximately 2000-3000 Angstroms thick) has been deposited and doped and an anisotropic etch performed to leave well-defined polysilicon spacers 16,18 along the opposing edges of the polysilicon floating gate 10.

Figure 2C:
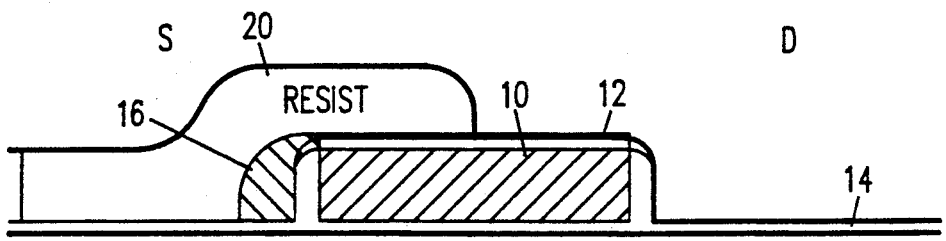

As shown in FIG. 2C, the source side S of the structure is then masked with photoresist 20 and the polysilicon spacer 18 on the drain side D is etched away using a selective silicon etch.

Figure 2D:
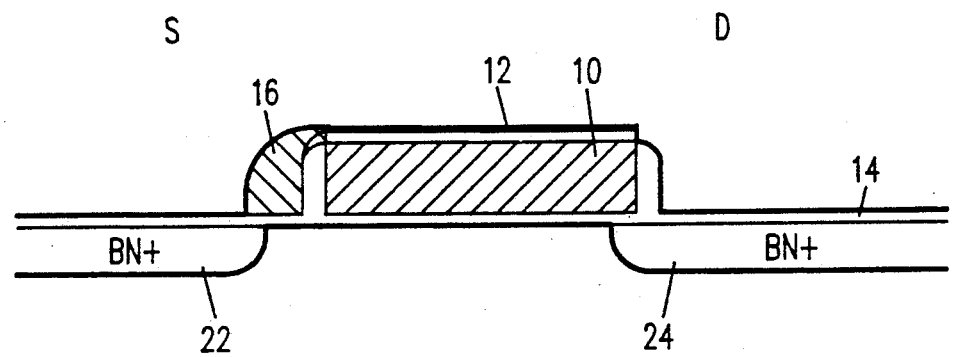

As shown in FIG. 2D, a self-aligned arsenic N+ implant is then performed to form source region 22 and drain region 24. That is, on the source side S, the inner edge of the source region 22 is defined by the outer edge of the polysilicon spacer 16. Similarly, on the drain side D, the inner edge of the drain region 24 is defined by the edge of the polysilicon floating gate 10.

The junction depth of the arsenic implant is chosen such that the buried N+ drain region 24 underlaps the polysilicon floating gate 10 on the drain side D and such that the buried N+ source region 22 underlaps the polysilicon spacer 16 on the source side S, but does not reach all the way across to the polysilicon floating gate 10. In this way, a gated channel region is formed under the polysilicon spacer 16 on the source side S.

Figure 1A:
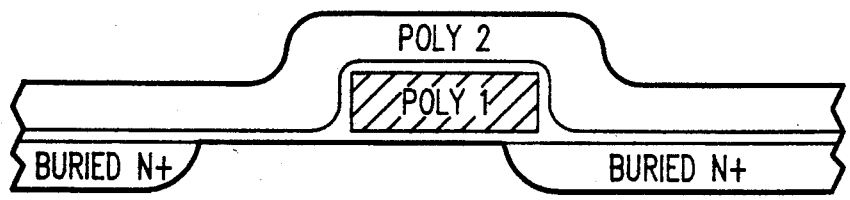
FIG. 1A is a cross-sectional view illustrating a conventional virtual-ground split-gate EPROM cell.
Figure 2E:
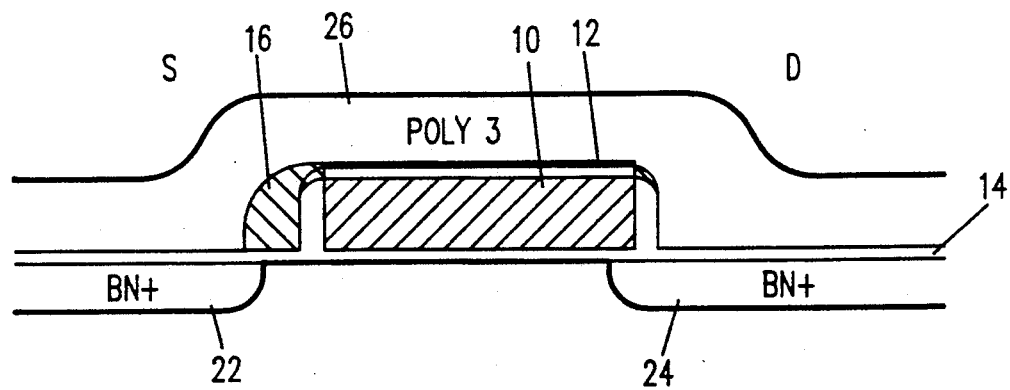

As shown in FIG. 2E, a layer of third polysilicon 26 is then deposited and doped. This third polysilicon layer 26 is then masked and etched to form the control gate of the cell. Since the third polysilicon layer 26 is an intimate contact with the polysilicon spacer 16, a direct electrical connection is formed between them. In this way, the final cell structure, shown in FIG. 2E, is electrically equivalent to the conventional virtual-ground EPROM cell shown in FIG. 1A.

The significant advantage of the structure shown in FIG. 2E is that the channel length of the series transistor is defined by the width of the polysilicon spacer 16 and by the lateral diffusion of the buried N+ source region 22, both of which are parameters that can be very tightly controlled. Therefore, the FIG. 2E structure is much more alignment insensitive than are prior art split-gate EPROM cell structures and, thus, can be laid out in smaller areas and show much less variation in electrical performance.

Variances on the basic process and structure described above may be utilized in practicing the present invention, but all retain the central concept of using a polysilicon spacer to define the channel length of the series transistor in a split-gate memory cell.

Figure 3A:
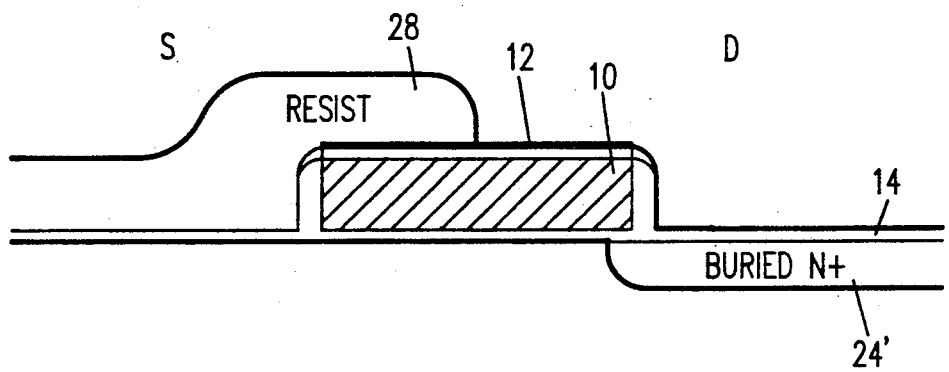
FIGS. 3A and 3B are cross-sectional views illustrating alternative steps utilizable in forming a split-gate memory cell in accordance with the present invention.
Figure 3B:
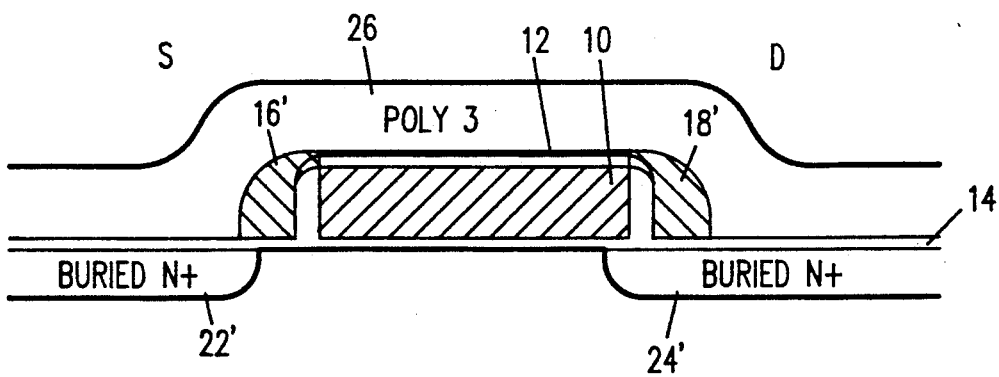

In accordance with an alternative and preferred embodiment of the invention, the need to etch the polysilicon spacer 18 (FIG. 2B) away from the drain side D of the polysilicon floating gate 10 can be eliminated. In this case, processing follows the previous flow to FIG. 2A. Referring to FIG. 3A, at this point, a photoresist masking layer 28 is applied to protect the source side S of the structure and an initial self-aligned N+ implant is performed to form buried N+ drain region 24'. Polysilicon spacers 16' and 18' are then formed as discussed above with respect to FIG. 2B. However, the spacer removal step described with respect to FIG. 2C can now be eliminated, since the early buried N+ implant forms a conducting layer under the polysilicon spacer 18' on the drain side D. Processing then continues as previously described, arriving at the final structure shown in FIG. 3B.

Figure 1B:
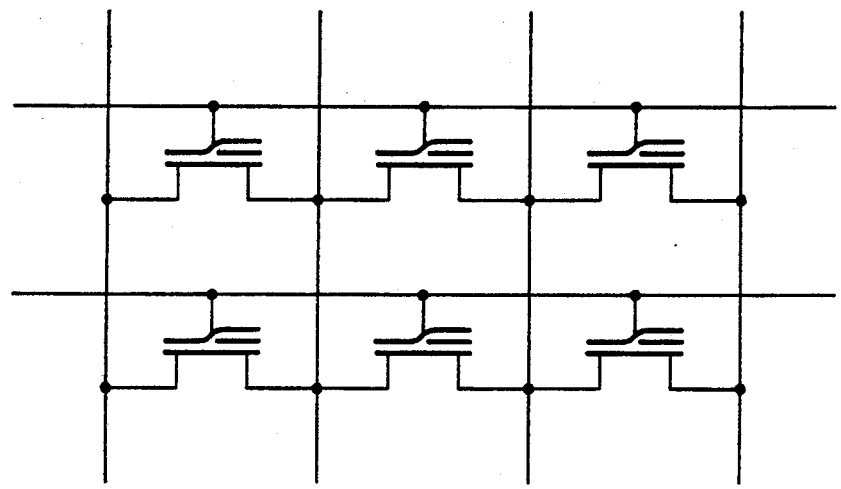
FIG. 1B is a simple schematic illustration of a virtual-ground EPROM array configuration.
Figure 1C:
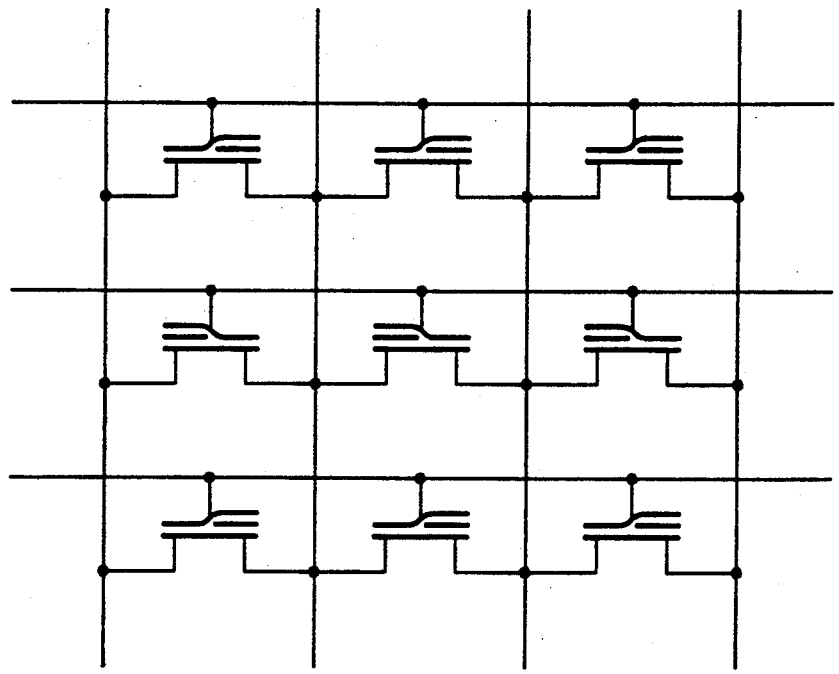
FIG. 1C is a simple schematic illustrating a staggered virtual-ground EPROM array configuration.
Figure 4:
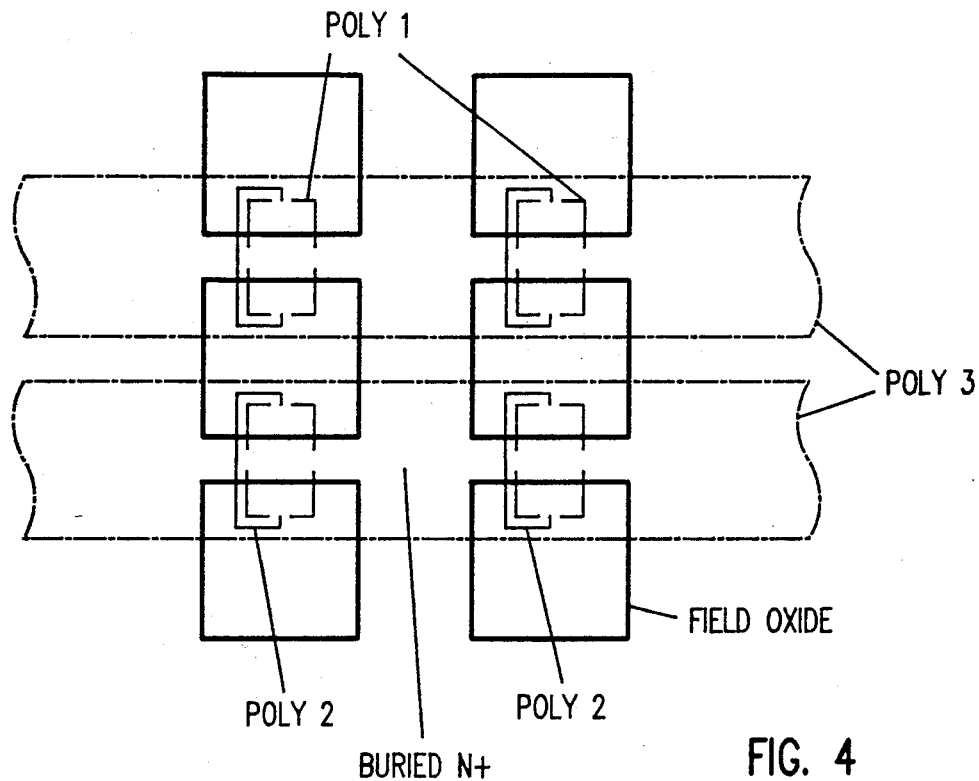
FIG. 4 is plan view of a split-gate memory cell in accordance with the present invention in a virtual-ground configuration.
Figure 5:
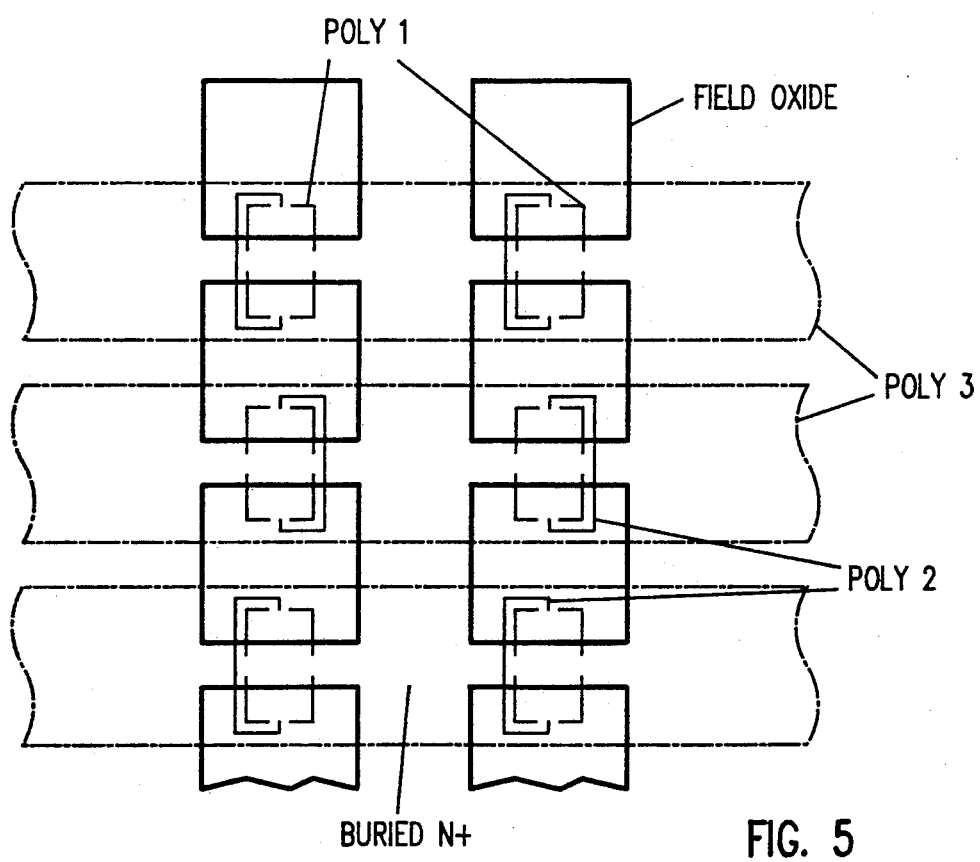
FIG. 5 is a plan view of a split-gate memory cell in accordance with the present invention in a staggered virtual-ground configuration.

In the foregoing description of the invention, only the cell cross-section has been discussed. FIG. 4 shows a plan view of the cell, laid out to correspond topologically with the prior art array shown in FIG. 1B. A plan view of the cell with a staggered layout corresponding to that shown in prior art FIG. 1C is shown in FIG. 5.

It should be understood that various alternatives to the embodiments of the invention described herein may be employed in practicing the invention. It is intended that the following claims defined the scope of the invention and that structures and methods within the scope of these claims and their equivalents be covered thereby.

What is claimed is:

1. A method of forming a split-gate memory cell in a semiconductor substrate of a first conductivity type, the method comprising the steps of:
   (a) forming a conductive floating gate overlying the substrate but electrically insulated therefrom by a layer of first dielectric material, the floating gate having a layer of second dielectric material formed thereon;
   (b) forming a sidewall insulator on a first edge of the floating gate;
   (c) forming a conductive spacer adjacent to the first edge of the floating gate but insulated therefrom by the sidewall insulator;
   (d) forming first and second regions of a second conductivity type in the substrate using a second edge of the floating gate to define an edge of the first region, and using an edge of the conductive spacer to define an edge of the second region;
   (e) forming a conductive control gate in electrical contact with the conductive spacer and overlying but electrically insulated from the floating gate by the layer of second dielectric material.

2. A method of forming a split-gate memory cell in a P- silicon substrate, the method comprising the steps of:
   (a) forming a polysilicon floating gate overlying the substrate but electrically insulated therefrom by a layer of gate oxide, the floating gate having a layer of ONO formed thereon;
   (b) forming sidewall oxide on a first edge of the floating gate;
   (c) forming a polysilicon spacer adjacent to the first edge of the floating gate but insulated therefrom by the sidewall oxide;
   (d) forming first and second N+ regions in the substrate using a second edge of the floating gate to define an edge of the first N+ region and using an edge of the polysilicon spacer to define an edge of the second N+ region; and
   (e) forming a conductive control gate in electrical contact with the polysilicon spacer and overlying but electrically insulated from the floating gate by the layer of ONO.

3. A method of forming a split-gate memory cell in a semiconductor substrate of a first conductivity type, the method comprising the steps of:
   (a) forming a conductive floating gate overlying the substrate but electrically insulated therefrom by a layer of first dielectric material, the floating gate having a layer of second dielectric material formed thereon;
   (b) forming a first region of a second conductivity type in the substrate using a first edge of the floating gate to define an edge of the first region;
   (c) forming first and second sidewall insulators on the first edge and a second opposing edge, respectively, of the floating gate;
   (d) forming first and second conductive spacers adjacent to the first and second edges, respectively, of the floating gate but insulated therefrom by the respective first and second sidewall insulators;
   (e) forming a second region of the second conductivity type in the substrate using an edge of the second conductive spacer to define an edge of the second region; and
   (f) forming a conductive control gate in electrical contact with the first and second conductive spacers and overlying but electrically insulated from the floating gate by the layer of second dielectric material.

4. A method of forming a split-gate memory cell in a P- silicon substrate, the method comprising the steps of:
   (a) forming a polysilicon floating gate overlying the substrate but electrically insulated therefrom by a layer of gate oxide, the floating gate having a layer of ONO formed thereon;
   (b) forming a first N+ region in the substrate using a first edge of the floating gate to define an edge of the first N+ region;
   (c) forming first and second sidewall oxide layers on the first edge and a second opposing edge, respectively, of the floating gate;
   (d) forming first and second polysilicon spacers adjacent to the first and second edges, respectively, of the floating gate but insulated therefrom by the respective first and second sidewall oxide layers;
   (e) forming a second N+ region in the substrate using an edge of the second polysilicon spacer to define an edge of the second N+ region; and
   (f) forming a polysilicon control gate in electrical contact with the first and second polysilicon spacers and overlying but electrically insulated from the floating gate by the layer of ONO.

* * * * *